US012765264B2

(12) United States Patent
Sun et al.

(10) Patent No.: US 12,765,264 B2
(45) Date of Patent: Oct. 13, 2026

(54) STRESS-RESISTANT TRACE STRUCTURE AND PIEZOELECTRIC DETECTION DEVICE MADE THEREOF

(71) Applicants: Interface Technology (ChengDu) Co., Ltd., Chengdu (CN); Interface Optoelectronics (ShenZhen) Co., Ltd., Shenzhen (CN); General Interface Solution Limited, Miaoli County (TW)

(72) Inventors: Bo-Jhang Sun, Miaoli County (TW); Chih-Chin Ko, Miaoli County (TW); Hsin-Yu Chen, Miaoli County (TW); Ji-An Chen, Miaoli County (TW)

(73) Assignees: Interface Technology (ChengDu) Co., Ltd., Chengdu (CN); Interface Optoelectronics (ShenZhen) Co., Ltd., Shenzhen (CN); General Interface Solution Limited, Miaoli County (TW)

( * ) Notice: Subject to any disclaimer, the term of this patent is extended or adjusted under 35 U.S.C. 154(b) by 912 days.

(21) Appl. No.: 18/110,017

(22) Filed: Feb. 15, 2023

(65) Prior Publication Data

US 2024/0196751 A1 Jun. 13, 2024

(30) Foreign Application Priority Data

Dec. 9, 2022 (CN) ........................ 202211580035.8

(51) Int. Cl.

| | |
|---|---|
| ***H10N 30/88*** | (2023.01) |
| ***H10N 30/30*** | (2023.01) |
| ***H10N 30/857*** | (2023.01) |
| ***H10N 30/87*** | (2023.01) |
| *G01L 1/16* | (2006.01) |

(52) U.S. Cl.

CPC ........... *H10N 30/88* (2023.02); *H10N 30/302* (2023.02); *H10N 30/857* (2023.02); *H10N 30/875* (2023.02); *G01L 1/16* (2013.01)

(58) Field of Classification Search

CPC .... H10N 30/88; H10N 30/302; H10N 30/875; H10N 30/857

See application file for complete search history.

(56) References Cited

U.S. PATENT DOCUMENTS

2004/0145430 A1* 7/2004 Metzger .................. H03H 3/02 333/191
2016/0195974 A1* 7/2016 Liu ....................... G06F 3/0443 216/13
2019/0362118 A1* 11/2019 Ahn .................. G06V 40/1306
2021/0175312 A1* 6/2021 Wang .................. H10K 59/131

* cited by examiner

*Primary Examiner* — Bryan P Gordon
(74) *Attorney, Agent, or Firm* — Troutman Pepper Locke LLP; Tim Tingkang Xia, Esq.

(57) ABSTRACT

Disclosed is a stress-resistant trace structure and a piezoelectric detection device made thereof. The stress-resistant trace structure includes a patterned trace layer and a porous anti-stress layer. The patterned trace layer has a non-linear pattern and is configured on the porous anti-stress layer. Specifically, the porous anti-stress layer has a plurality of through holes, and the through holes are vertically interlaced with the non-linear pattern.

11 Claims, 5 Drawing Sheets

400

STRESS-RESISTANT TRACE STRUCTURE AND PIEZOELECTRIC DETECTION DEVICE MADE THEREOF

CROSS-REFERENCE TO RELATED APPLICATIONS

This application claim priority to Chinese application Numbered 202211580035.8, filed Dec. 9, 2022, which is herein incorporated by reference in its' integrity.

BACKGROUND OF THE INVENTION

Field of the Invention

The present disclosure relates to a stress-resistant trace structure, in particular to a piezoelectric detection device with a stress-resistant trace structure.

Description of the Related Art

A piezoelectric detection device (or "piezoelectric sensor") is a sensor based on the piezoelectric effect. It is a self-generating-electric and electromechanical conversion sensor. Its sensitive element is made of piezoelectric material. When a piezoelectric material is subjected to a force, an electric charge is generated on its surface. After the charge is amplified by the charge amplifier, and the measuring circuit and the impedance are transformed, it becomes an electric output proportional to the received external force. Piezoelectric sensors are used to measure force and non-electrical quantities that can be converted into electricity. It brings advantages such as wide frequency band, high sensitivity, high signal-to-noise ratio, simple structure, reliable operation and light weight. The disadvantage is that some piezoelectric materials require moisture-proof measures, and the output DC response is poor, and high input impedance circuits or charge amplifiers need to be used to overcome this defect. (See Baidu Encyclopedia; https://baike-.baidu.hk/item/piezoelectric sensor/8835700)

Please refer to FIG. 1, it is a schematic diagram showing some components in a piezoelectric detection device in the prior art. As shown in FIG. 1, some elements of a conventional piezoelectric detection device 100 include electrode layers 104*a*, 104*b* and a polyvinylidene fluoride (PVDF) layer 102 interposed therebetween. As to the conventional piezoelectric detection device 100, there is a problem that the conductive traces in the device are easily broken due to stress when the device is bent.

Therefore, a stress-resistant trace structure and a piezoelectric detection device made thereof that are capable of solving the aforementioned drawbacks is desirable.

SUMMARY OF THE INVENTION

In view of this, the disclosure provides a stress-resistant trace structure and a piezoelectric detection device made thereof, so as to avoid the aforementioned problems that each patterned electrode (or "electrode trace", etc.) is stressed and broken as being bent. It should be noted that each element, module, unit or component in the anti-stress trace structure and the piezoelectric detection device made thereof is flexible.

Disclosed herein is a stress-resistant trace structure that includes a patterned trace layer and a porous anti-stress layer. The patterned trace layer has a non-linear pattern and is configured on the porous anti-stress layer. Specifically, the porous anti-stress layer has a plurality of through holes, and the through holes are vertically interlaced with the non-linear pattern.

In another embodiment, the stress-resistant trace structure is utilized to form a piezoelectric detection device, and the piezoelectric detection device is electrically coupled to a flexible print circuit board through a plurality of conductive wires.

In another embodiment, the stress-resistant trace structure and another stress-resistant trace structure are respectively disposed on opposite sides of a flexible piezoelectric material layer to form a piezoelectric detection device.

In another embodiment, the flexible piezoelectric material layer is polyvinylidene fluoride (PVDF), a copolymer of polyvinylidene fluoride or a combination thereof.

In another embodiment, the patterned trace layer is composed of an electrode that is arranged in the non-linear pattern.

In another embodiment, the non-linear pattern is a regular or non-regular repeating pattern.

In another embodiment, the non-linear pattern is adjacent to the through holes.

In another embodiment, the non-linear pattern surrounds the through holes.

In another embodiment, the non-linear pattern is conformally configured with the through holes.

Disclosed herein is another exemplary piezoelectric detection device, comprising a flexible piezoelectric material layer, a plurality of passivation layers and a plurality of patterned electrode trace layers. The flexible piezoelectric material layer is sandwiched between two adjacent porous deposition layers. The passivation layers are respectively disposed adjacent to each porous deposition layer and away from the flexible piezoelectric material layer. Each patterned electrode trace layer is sandwiched between each passivation layer and each porous deposition layer. Each patterned electrode trace layer has a patterned electrode. Furthermore, each porous deposition layer has through holes, and the through holes are vertically interlaced with each patterned electrode, so that each patterned electrode prevents from being broken as being bent.

In another embodiment, the piezoelectric detection device is electrically coupled to a flexible print circuit board through a plurality of conductive wires.

In another embodiment, the flexible piezoelectric material layer is polyvinylidene fluoride (PVDF), a copolymer of polyvinylidene fluoride or a combination thereof.

In another embodiment, the patterned electrode forms a pattern that is a non-linear pattern.

In another embodiment, the non-linear pattern is a regular or non-regular repeating pattern.

In another embodiment, the non-linear pattern is adjacent to the through holes.

In another embodiment, the non-linear pattern surrounds the through holes.

In another embodiment, the non-linear pattern is conformally configured with the through holes.

Disclosed herein is still another exemplary piezoelectric detection device electrically coupled to a flexible print circuit board through a plurality of conductive wires. The piezoelectric detection device a stress-resistant trace structure and a plurality of protective layers. Each protective layer is arranged adjacent to each porous anti-stress layer and away from a flexible piezoelectric material layer. The flexible piezoelectric material layer is polyvinylidene fluoride (PVDF), a copolymer of polyvinylidene fluoride or a combination thereof. The stress-resistant trace structure includes a patterned trace layer and a porous anti-stress layer. The patterned trace layer has a non-linear pattern and is configured on the porous anti-stress layer. Specifically, the porous anti-stress layer has a plurality of through holes, and the through holes are vertically interlaced with the non-linear pattern. The stress-resistant trace structure and another stress-resistant trace structure are respectively disposed on opposite sides of the flexible piezoelectric material layer to form a piezoelectric detection device.

In another embodiment, the non-linear pattern is composed of a plurality of S-like patterns, and the S-like patterns are regularly repeated.

In another embodiment, the non-linear pattern is composed of a plurality of parallelogram patterns, and the parallelogram patterns are regularly repeated.

DESCRIPTION OF THE PREFERRED EMBODIMENTS

First of all, it should be noted that the phrase "stress-resistant trace structure" recited in the disclosure refers to a laminated structure, and a porous anti-stress layer in the laminated structure is equipped with a plurality of through holes to eliminate stress. In other words, the stress-resistant trace structure is capable of preventing the traces (such as electrodes) from being broken due to stress as being bent. Furthermore, the "piezoelectric detection device" disclosed in the specification refers to a device that at least includes the anti-stress trace structure and exhibits piezoelectric characteristics.

It should also be noted that, in embodiments of this disclosure, the stress-resistant trace structure includes, but not limited to, a patterned trace layer that is disposed on the porous anti-stress layer. The patterned trace layer has a non-linear pattern formed by one or more patterned electrodes. The through holes of the porous anti-stress layer are vertically interlaced with the non-linear pattern of the patterned trace layer.

Additionally, in the embodiment of the disclosure, a relevant structural stress analysis software is utilized based on an internationally recognized CAE standard, performing a structural stress analysis of the anti-stress trace structure and the piezoelectric detection device made thereof.

Figure 1:
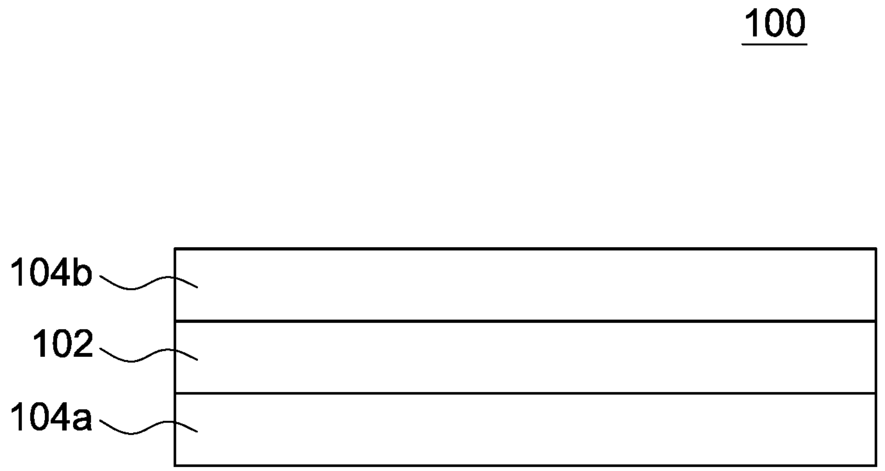
FIG. 1 is a schematic diagram showing some components in a piezoelectric detection device in the prior art.
Figure 2:
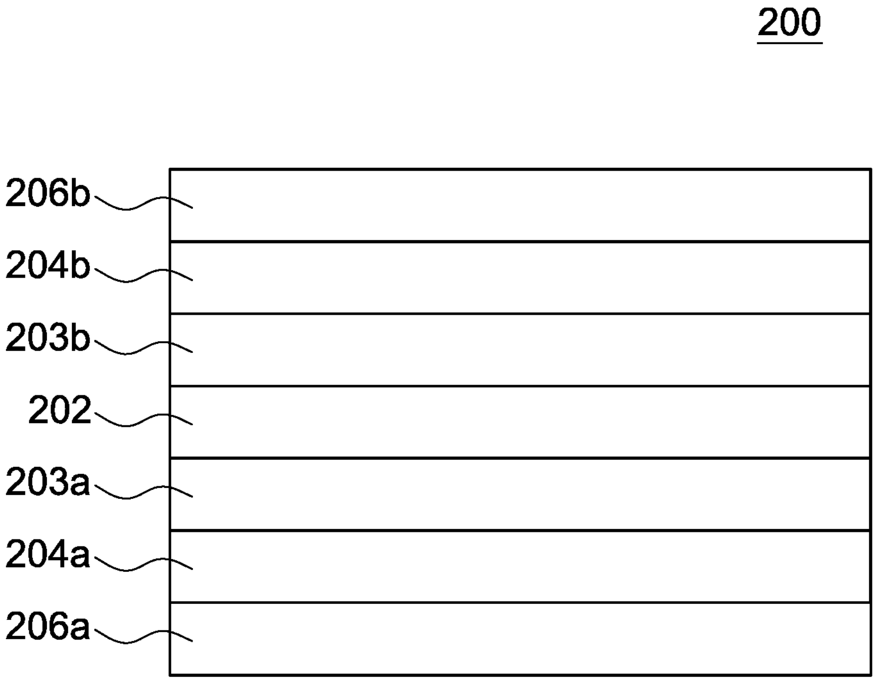
FIG. 2 is a schematic diagram showing an illustrative piezoelectric detection device in accordance with an embodiment.

Continuing to refer to FIG. 2, it is a schematic diagram showing an illustrative piezoelectric detection device in accordance with an embodiment. As shown in FIG. 2, some components of a piezoelectric detection device 200 include a flexible piezoelectric material layer 202, a deposition layer 203*a*, a deposition layer 203*b*, an electrode layer 204*a*, an electrode layer 204*b*, a passivation layer 206 a and a passivation layer 206*b*. The deposition layer 203*a* and the deposition layer 203*b* are respectively formed on opposite surfaces of the flexible piezoelectric material layer 202. The electrode layer 204*a* is adjacent to the deposited layer 203*a*, and the electrode layer 204*b* is adjacent to the deposited layer 203*b*. The passivation layer 206*a* covers the electrode layer 204*a*, and the passivation layer 206*b* covers the electrode layer 204*b*. It should be noted that, in embodiments of the present invention, the deposition layer 203*a* and the deposition layer 203*b* respectively have a plurality of through holes so as to serve as a porous anti-stress layer. In addition, in embodiments of the disclosure, either the electrode layer 204*a* or the electrode layer 204 is a patterned trace layer and has a non-linear pattern.

Figure 3:
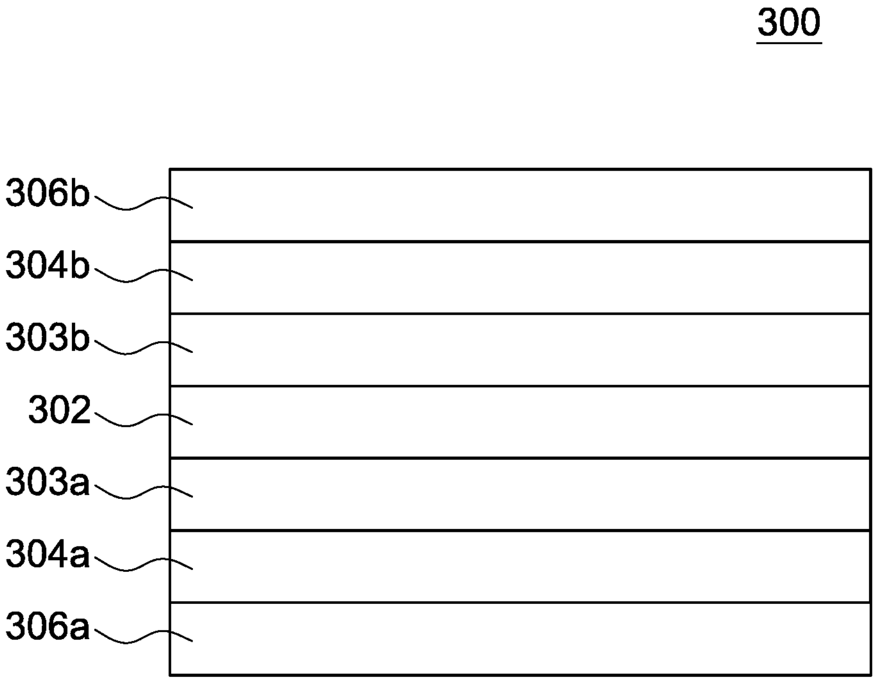
FIG. 3 is a schematic diagram showing an illustrative piezoelectric detection device in accordance with another embodiment.

Continuing to refer to FIG. 3, it is a schematic diagram showing an illustrative piezoelectric detection device in accordance with another embodiment. Similarly, as shown in FIG. 3, some components of a piezoelectric detection device 300 include a flexible piezoelectric material layer 302, a deposition layer 303*a*, a deposition layer 303*b*, an electrode layer 304*a*, an electrode layer 304*b*, a passivation layer 306*a* and a passivation layer 306*b*. The flexible piezoelectric material layer 302 is sandwiched between the deposition layer 303*a* and the deposition layer 303*b*. The electrode layer 304*a* and the electrode layer 304*b* are disposed on the deposition layer 303*a* and the deposition layer 303*b*, respectively. The passivation layer 306*a* and the passivation layer 306*b* are respectively formed on the electrode layer 304*a* and the electrode layer 304*b*. It should also be noted that, in embodiments of the disclosure, the deposition layer 303*a* and the deposition layer 303*b* are also configured with a plurality of through holes, serving as a porous anti-stress layer. Furthermore, in another embodiment of the disclosure, the electrode layer 304*a* and the electrode layer 304 are also a patterned trace layer and have a non-linear pattern. The deposition layer 203*a*, the deposition layer 203*b*, the electrode layer 204*a*, the electrode layer 204 in FIG. 2 and the deposition layer 303*a*, the deposition layer 303*b*, the electrode layer 304*a*, the electrode layer 304 in FIG. 3 show differences in geometric shapes, and such differences will be described later.

Figure 4:
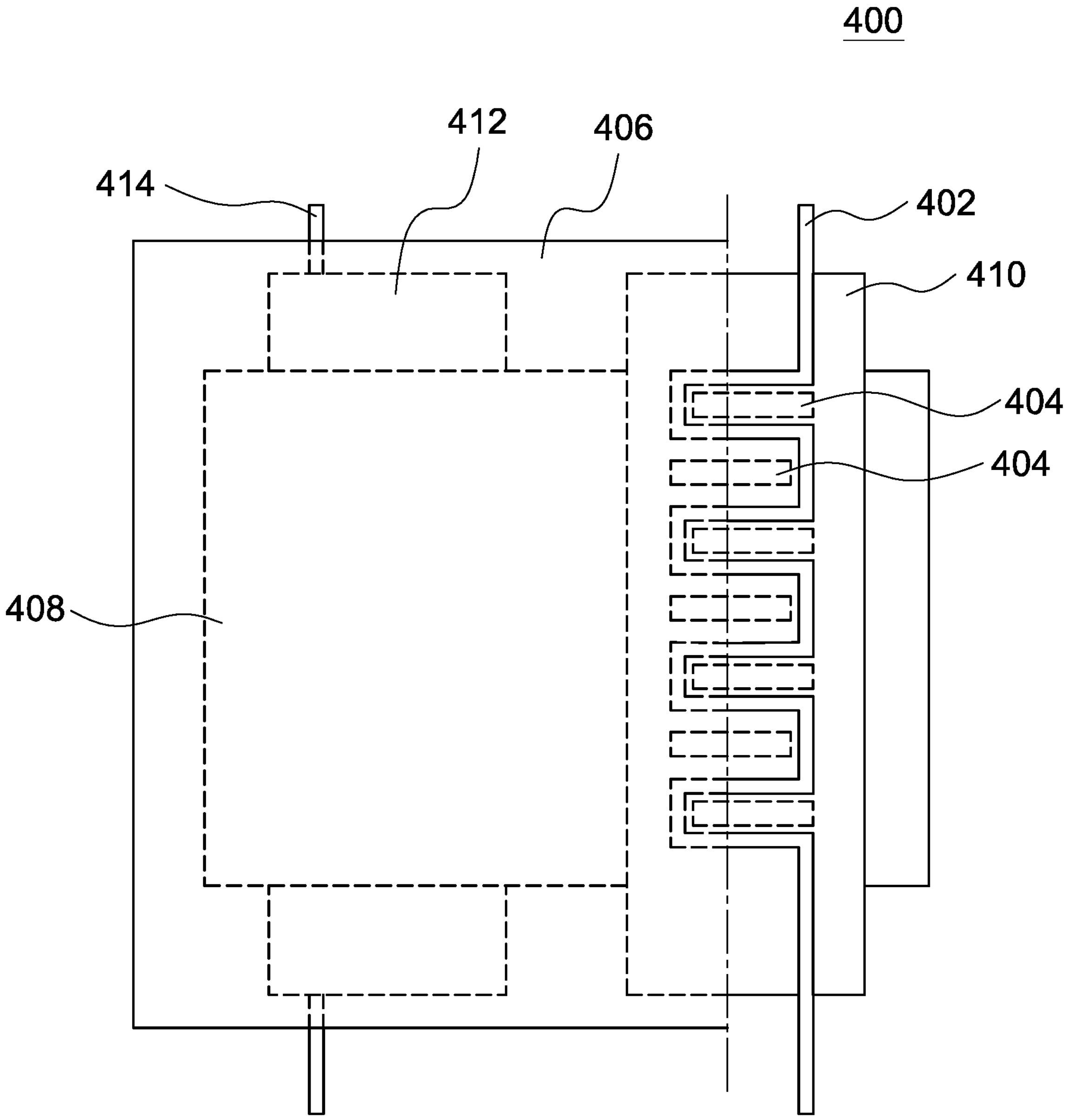
FIG. 4 is a schematic diagram showing an illustrative stress-resistant trace structure in accordance with an embodiment.

Continuing to refer to FIG. 4, it is a schematic diagram showing an illustrative stress-resistant trace structure in accordance with an embodiment. As shown in FIG. 4, in embodiments of the present invention, some elements of the piezoelectric detection device, i.e., the anti-stress trace structure module 400, include two anti-stress trace structures. The stress-resistant trace structure module 400 includes a flexible piezoelectric material layer 408, a deposition layer 410, a deposition layer 412, an electrode layer 402, an electrode layer 414, and a passivation layer 406. It should be noted that, in embodiments of the disclosure, the deposition layer 410 and the deposition layer 412 are porous anti-stress layers, while the electrode layer 402 and the electrode layer 414 are patterned trace layers. For example, the electrode layer 402 has a non-linear pattern and is disposed on the deposition layer 410. In an embodiment of the present invention, the deposited layer 410 serving as a porous anti-stress layer has a plurality of through holes 404, and the through holes 404 are vertically interlaced with the non-linear pattern formed by the electrode layer 402. Furthermore, in embodiments of the present invention, the non-linear pattern formed by the electrode layer 402 is an S-like pattern that is regularly repeated. Corresponding to the S-like pattern formed by the electrode layer 402, the through holes 404 of the deposition layer 410 are adjacent to the non-linear pattern. In other embodiments of the present invention, the S-like pattern formed by the electrode layer 402 surrounds the through holes 404 of the deposition layer 410. In still another embodiment of the disclosure, the S-like pattern formed by the electrode layer 402 is conformally configured with the through holes 404 of the deposited layer 410. It should be noted that, in embodiments of the present invention, the shape and size of the through holes 404 of the deposition layer 410 can be adjusted depending on the pattern formed by the electrode layer 402. In addition, in embodiments of the present invention, the flexible piezoelectric material layer 408 may be polyvinylidene fluoride (PVDF), a copolymer of polyvinylidene fluoride, or a combination thereof.

Figure 5:
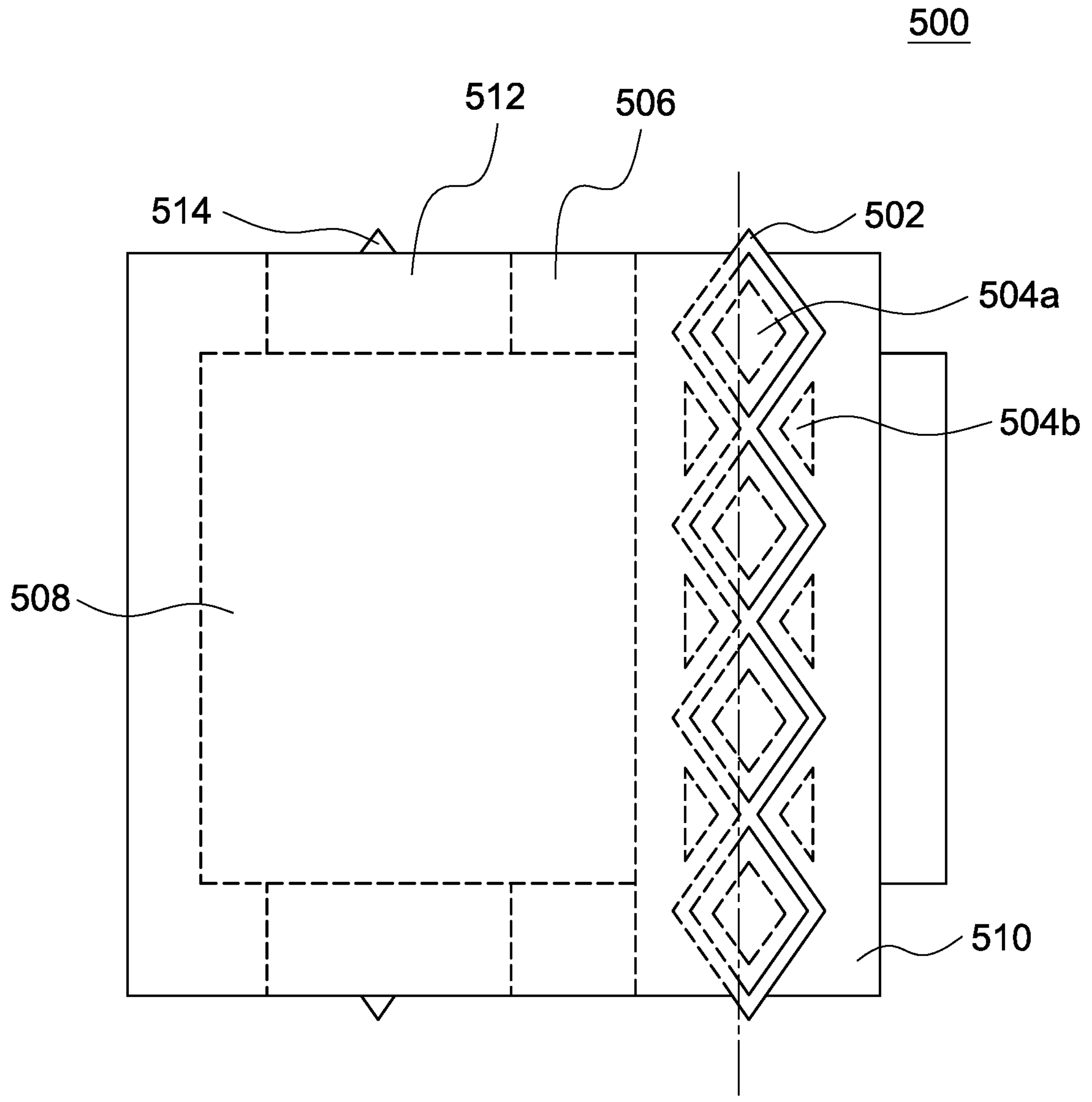
FIG. 5 is a schematic diagram showing an illustrative stress-resistant trace structure in accordance with another embodiment.

Continuing to refer to FIG. 5, it is a schematic diagram showing an illustrative stress-resistant trace structure in accordance with another embodiment. As shown in FIG. 5, in embodiments of the present invention, some elements of the piezoelectric detection device, i.e., the stress-resistant trace structure module 500, include two stress-resistant trace structures. The stress-resistant trace structure module 500 includes a flexible piezoelectric material layer 508, a deposited layer 510, a deposited layer 512, an electrode layer 502, an electrode layer 514, and a passivation layer 506. It should be noted that, in embodiments of the present invention, the deposition layer 510 and the deposition layer 512 are porous anti-stress layers, while the electrode layer 502 and the electrode layer 514 are patterned trace layers. For example, the electrode layer 502 has a non-linear pattern and is disposed on the deposition layer 510. In an embodiment of the present invention, the deposited layer 510 serving as the porous anti-stress layer has a plurality of through holes 504*a*, 504*b*, and the through holes 504*a*, 504*b* are vertically interlaced with the non-linear pattern formed by the electrode layer 502. Furthermore, in embodiments of the present invention, the non-linear pattern formed by the electrode layer 502 is a geometric pattern such as a parallelogram or a rhombus that is regularly repeated. Corresponding to the geometric pattern formed by the electrode layer 502 such as parallelogram or rhombus, the through holes 504*a*, 504*b* of the deposition layer 510 are also adjacent to the non-linear pattern. In other embodiments of the present invention, geometric patterns such as parallelogram or rhombus formed by the electrode layer 502 also surround the through holes 504*a*, 504*b* of the deposition layer 510. In other embodiments of the present invention, geometric patterns such as parallelogram or rhombus formed by the electrode layer 502 are also conformally configured with the through holes 504*a*, 504*b* of the deposition layer 510. It should be noted that, in embodiments of the present invention, the shape and size of the through holes 504*a*, 504*b* of the deposited layer 510 can be adjusted according to the pattern formed by the electrode layer 502. For example, the shape for the holes 504*a*, 504*b* of the deposition layer 510 may be a geometric pattern such as parallelogram, rhombus or triangle. In addition, in an embodiment of the present invention, the flexible piezoelectric material layer 508 may also be polyvinylidene fluoride (PVDF), a copolymer of polyvinylidene fluoride, or a combination thereof.

In addition, in embodiments of the present invention, the stress-resistant trace structure module 400 of FIG. 4 and the stress-resistant trace structure module 500 of FIG. 5 are used to make a piezoelectric detection device, and the piezoelectric detection device is electrically coupled to a flexible printed circuit board through a plurality of conductive wires.

As mentioned above, in embodiments of the present invention, the stress-resistant trace structure and another stress-resistant trace structure are respectively arranged on opposite sides of a flexible piezoelectric material layer, so as to form a piezoelectric detection device. The piezoelectric detection device includes: a flexible piezoelectric material layer sandwiched between two adjacent porous deposition layers; a plurality of passivation layers respectively adjacent to each of the porous deposition layers and away from the flexible piezoelectric material layer; and a plurality of patterned electrode trace layers sandwiched between each of the passivation layers and each of the porous deposition layers. Each of the patterned electrode trace layers has a patterned electrode. Each of the porous deposition layers has through holes vertically arranged interlaced with the patterned electrodes, so as to prevent the patterned electrodes from being broken due to stress as being bent. In addition, in embodiments of the present invention, the piezoelectric detection device is electrically coupled to a flexible printed circuit board through a plurality of conductive wires. In an embodiment of the present invention, the flexible piezoelectric material layer is polyvinylidene fluoride (PVDF), a copolymer of polyvinylidene fluoride or a combination thereof. In an embodiment of the present invention, the pattern formed by the patterned electrodes is a non-linear pattern. In an embodiment of the present invention, the non-linear pattern is a pattern that is regularly or irregularly repeated.

In an embodiment of the present invention, the passivation layer serves as a protective layer capable of preventing components from being scratched or damaged by external force.

While this invention has been described with respect to at least one embodiment, the invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A stress-resistant trace structure comprising:

a porous anti-stress layer having a plurality of through holes;

a patterned trace layer having a non-linear pattern and being configured on the porous anti-stress layer, wherein the through holes of the porous anti-stress layer are vertically interlaced with the non-linear pattern of the patterned trace layer.

2. The stress-resistant trace structure of claim 1, wherein the stress-resistant trace structure and another stress-resistant trace structure are respectively disposed on opposite sides of a flexible piezoelectric material layer to form a piezoelectric detection device.

3. The stress-resistant trace structure of claim 2, wherein the flexible piezoelectric material layer is polyvinylidene fluoride (PVDF), a copolymer of polyvinylidene fluoride or a combination thereof.

4. The stress-resistant trace structure of claim 1, wherein the patterned trace layer is composed of an electrode that is arranged in the non-linear pattern.

5. The stress-resistant trace structure of claim 1, wherein the non-linear pattern is a regular or non-regular repeating pattern.

6. The stress-resistant trace structure of claim 1, wherein the non-linear pattern is adjacent to the through holes.

7. The stress-resistant trace structure of claim 1, wherein the non-linear pattern surrounds the through holes.

8. The stress-resistant trace structure of claim 1, wherein the non-linear pattern is conformally configured with the through holes.

9. A piezoelectric detection device, comprising:

the stress-resistant trace structures as recited in claim 2; and a plurality of protective layers, each being arranged adjacent to each porous anti-stress layer and away from the flexible piezoelectric material layer;

wherein the flexible piezoelectric material layer is polyvinylidene fluoride (PVDF), a copolymer of polyvinylidene fluoride or a combination thereof.

10. The piezoelectric detection device of claim 9, wherein the non-linear pattern is composed of a plurality of S-like patterns, the S-like patterns being regularly repeated.

11. The piezoelectric detection device of claim 9, wherein the non-linear pattern is composed of a plurality of parallelogram patterns, the parallelogram patterns being regularly repeated.

* * * * *